United States Patent [19]

Hsu

[11] 4,353,159
[45] Oct. 12, 1982

[54] METHOD OF FORMING SELF-ALIGNED CONTACT IN SEMICONDUCTOR DEVICES

[75] Inventor: Sheng T. Hsu, Lawrenceville, N.J.

[73] Assignee: RCA Corporation, New York, N.Y.

[21] Appl. No.: 262,620

[22] Filed: May 11, 1981

[51] Int. Cl.³ .......................................... H01L 21/28
[52] U.S. Cl. ...................... 29/571; 29/578; 29/591; 148/187
[58] Field of Search ................ 29/571, 578, 591; 148/187; 357/23 TF

[56] References Cited

U.S. PATENT DOCUMENTS

| 4,178,674 | 12/1979 | Liu | 29/571 |
| 4,196,443 | 4/1980 | Dingwall | 357/68 |
| 4,225,875 | 9/1980 | Ipri | 357/23 TF |
| 4,236,167 | 11/1980 | Woods | 357/23 TF |
| 4,263,057 | 4/1981 | Ipri | 148/187 X |
| 4,312,680 | 1/1982 | Hsu | 29/571 X |
| 4,313,782 | 2/1982 | Sokoloski | 29/571 X |
| 4,318,216 | 3/1982 | Hsu | 29/571 |
| 4,322,881 | 4/1982 | Enomoto et al. | 148/187 X |

Primary Examiner—G. Ozaki
Attorney, Agent, or Firm—Birgit E. Morris; Donald S. Cohen; Lawrence P. Benjamin

[57] ABSTRACT

A method of forming buried contacts that eliminates the possibility of the inadvertent removal of portions of the silicon body is described wherein a patterned nitride masking layer is formed on portions of conductive interconnects and gate lines. Thereafter, a second oxide layer is grown in order to surround the masking nitride layer. The nitride layer may now be easily removed using a hot phosphoric acid dip which will etch away only the nitride layer to form contact openings in the oxide layer without affecting the underlying layer.

8 Claims, 6 Drawing Figures

METHOD OF FORMING SELF-ALIGNED CONTACT IN SEMICONDUCTOR DEVICES

BACKGROUND OF THE INVENTION

This invention relates to semiconductor processing and, more particularly, to a novel method of forming a self-aligned contact for a semiconductor device having multilevel interconnections.

As the density of the integrated circuit devices on a given chip size increased, the prior art has found that a significant saving in space can be realized by eliminating the necessarily large contact polysilicon pad areas that are required for buried contacts. A "buried contact" may be defined as a contact scheme which provides a low resistance, direct ohmic contact between two polycrystalline silicon (polysilicon) layers, between a polysilicon and a metal layer or between a polysilicon/metal layer and either bulk silicon or a layer of epitaxially grown silicon with no appreciable penalty for any undesirably formed junction at the point of contact. In a recently issued patent to A. G. F. Dingwall entitled "Buried Contact Configuration for CMOS/SOS Integrated Circuits," U.S. Pat. No. 4,196,443, which issued on Apr. 1, 1980 and assigned to the same assignee as the subject application, there is described various buried contact opening configurations formed in the insulating layer overlying the layer of monocrystalline silicon material and through which the buried contact is made. The shape of the opening for the buried contact is designed to minimize the removal of epitaxial silicon material in the event of misalignment. Thus, in the event of misalignment, the described opening will insure that there is sufficient contact to the silicon to form a useful device. In any event, this patent does not eliminate the possibility of the inadvertent removal of portions of the silicon body.

In another application entitled "Improved Method of Fabricating Buried Contacts," filed by M. A. Blumenfeld, Ser. No. 251,075, filed on Apr. 6, 1981, there is described another method for forming a buried contact in an MOS device wherein the area chosen for the buried contact is preconditioned and the contact opening is made smaller without the penalty of forming an undesirable junction. However, in the event of a serious misalignment, a certain amount of the underlying silicon will be removed without seriously affecting the device. Accordingly, any process that would maintain the integrity of the oxide layer which insulates the silicon from the interconnects and the gate lines would be desirable in that the defects would be markedly reduced.

SUMMARY OF THE INVENTION

A novel process is described for forming a buried contact in an MOS device wherein the contact hole is self-registered or aligned and is noted by the fact that it does not require any etching of the $SiO_2$ layer that protects and insulates the silicon body from the interconnects and gate lines.

DETAILED DESCRIPTION OF THE DRAWING

While the following exegesis will be presented in terms of using bulk silicon as an operative embodiment, I do not wish to be so limited. Those skilled in the art will readily recognize that while bulk silicon is shown as the body of the substrate, the principles herein espoused apply with equal validity to silicon-on-sapphire (SOS) devices. Further, spinel or monocrystalline beryllium oxide may be substituted for the sapphire.

Figure 1:
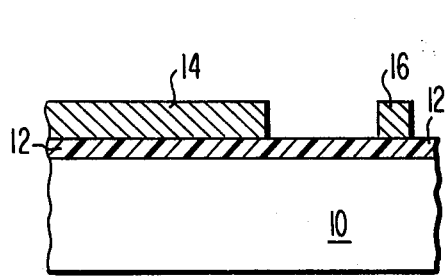
FIGS. 1–6 inclusive represent sectional views of the novel process of the subject invention indicating the various stages thereof.

Referring now to FIG. 1, there is shown a device in partial section wherein single crystalline silicon body 10 (either P-type or N-type) is provided with a layer 12 of thermally grown gate oxide ($SiO_2$). The exposed surface of $SiO_2$ gate oxide 12 also has an interconnection 14 and a gate line 16 deposited thereon. It should be understood that gate line 16 shown here as an extension of that portion of the gate member located above and between drain and source regions (not shown) and is awaiting connection to a buried contact. Similarly, interconnect 14 may be connected to a region somewhere else (not shown) but terminates as shown, while awaiting a buried contact to be made thereto. Thus, any preparatory work that must be done on the wafers prior to the deposition of the interconnect and gate line must be accomplished before my novel process may start.

Having formed interconnect 14 and gate line 16, one now proceeds with the formation of a buried contact by depositing about 2,000–4,000 Angstroms of silicon nitride layer 18 at a temperature ranging from about 600°–700° C. using a $SiH_4$ chemical vapor deposition technique. By maintaining the temperature in the range of 600°–700° C., one is assured that the dimensions of the areas between interconnect 14 and gate line 16 will be maintained in alignment and interconnect 14 and gate line 16 will not be disturbed. This is particularly important when dealing with gate lines having a geometry of about 1–1.5 micrometers.

Figure 2:
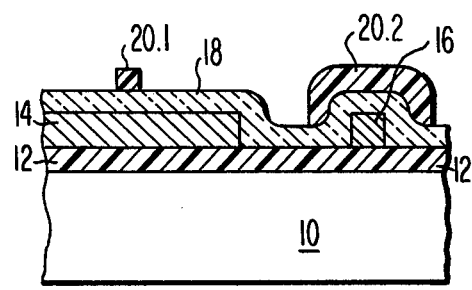

Thereafter, as shown in FIG. 2, a layer of photoresist material is deposited over silicon nitride layer 18 and portions thereof exposed to radiation. Thus, when the layer of photoresist material is hardened, the unexposed portions will adhere to layer 18 while the exposed portions will be washed away. The net result is the pattern shown in FIG. 2 wherein the gate member is covered by photoresist 20.2 and the contact for the interconnect is provided with photoresist portion 20.1.

Figure 3:
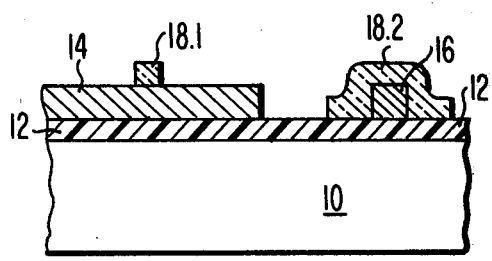

As shown in FIG. 3, the device is subjected to a plasma etch which etches only the exposed portions of silicon nitride layer 18, thereby forming contact masks 18.1 and 18.2. The nitride etching step is carried on until all of the unmasked silicon nitride is removed to expose portions of gate oxide 12 and interconnect 14 while maintaining the cap 18.2 around gate line 16. Similarly, contact opening mask 18.1 will remain after the photoresist 20.1 and 20.2 have been removed.

Figure 4:
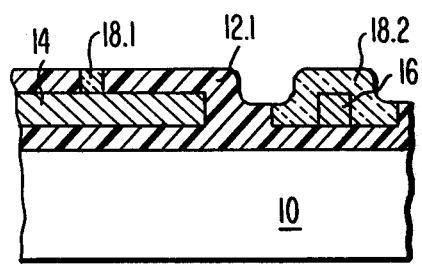
Figure 5:
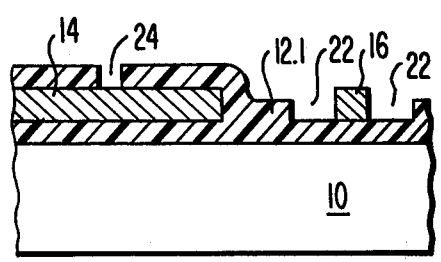

Having formed the cap 18.2 and contact opening mask 18.1, as shown in FIG. 4, a layer of thermal oxide 12.1 is then grown over the exposed or unmasked portions of polysilicon interconnect 14 as well as any exposed or unmasked portions of gate line 16 and gate oxide 12. This new layer is designated as 12.1 since this growth of thermal oxide will be indistinguishable from the previously grown gate oxide layer 12 (FIG. 1). Thereafter, as shown in FIG. 5, the nitride masks 18.1 and 18.2 are removed. This is done by first etching in a buffered HF solution to remove any oxide that may have been formed atop masks 18.1 and 18.2 and thus expose the nitride. This etch is then followed by a hot phosphoric acid etch which will completely remove masks 18.1 and 18.2 without affecting either oxide 12.1 or polysilicon interconnect 14. This produces contact openings 22 and 24.

Figure 6:
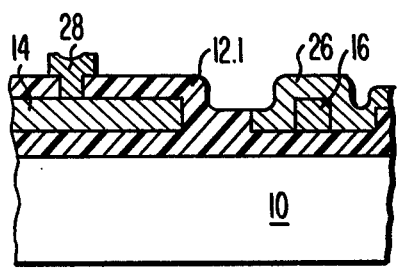

Referring now to FIG. 6, there is shown the final steps in my process wherein a layer of, for example, aluminum metal is deposited in a layer over the entire structure, masked in areas where the aluminum is desired to be retained and any exposed aluminum is subsequently etched to remove the undesired, unmasked portions and form buried contacts 28 (in opening 24) in ohmic contact with a portion of polysilicon line 14 and contact 26 (in opening 22) in ohmic contact with a portion of gate line 16.

Thus, I have provided a method of forming a buried contact which does not subject the underlying silicon oxide layer to any deleterious etching.

What is claimed is:

1. In a method of making an MOS device having a first layer of insulating material formed on the surface of a semiconductor body, a conductive gate line disposed over a channel region and at least one conductive interconnecting line disposed on the surface of the insulating material, the improved process for forming buried contacts to the conductive line and to the gate line comprising the steps of:
   growing the first layer of insulating material by the thermal oxidation of the semiconductor body;
   forming a patterned layer of masking material, to a given thickness, to define contact areas on portions of the interconnecting line and on portions of the gate line;
   growing a second layer of insulating material, to the given thickness, over the unmasked portions of the interconnecting line and over the unmasked portions of the gate line;
   removing the masking material from the contact areas; and
   depositing conductive material in each of the now formed buried contact areas in ohmic contact with the interconnecting line and with the gate line.

2. The process of claim 1, wherein:
   the masking material is silicon nitride deposited to a thickness of about 2,000–4,000 Angstroms.

3. The process of claim 2, wherein:
   the second layer of insulating material is silicon dioxide grown to a thickness of about 2,000–4,000 Angstroms in steam.

4. The process of claim 3, comprising the further step of:
   etching the surface of the exposed silicon nitride masking layer in a buffered HF solution to remove any silicon dioxide that may have been formed thereon during the growth of the second layer of insulating material.

5. The process of claim 4, wherein:
   the silicon nitride masking material is removed with a hot phosphoric acid etching solution.

6. The process of claim 5, comprising the further steps of:
   depositing a layer of patterned masking material over the layer of conductive material; and
   etching the unmasked layer of conductive material to form conductive contacts in the buried contact areas.

7. The process of claim 6, comprising the further step of:
   forming the semiconductor body as an island on an insulating substrate.

8. The process of claim 6, wherein:
   the insulating substrate is selected from the group consisting of sapphire, spinel and monocrystalline beryllium oxide.

* * * * *